(12) United States Patent
Obata

(10) Patent No.: US 9,035,707 B2
(45) Date of Patent: May 19, 2015

(54) METHOD FOR VARYING OSCILLATION FREQUENCY OF HIGH FREQUENCY OSCILLATOR

(75) Inventor: Hideyuki Obata, Fujimino (JP)

(73) Assignee: NEW JAPAN RADIO LTD (JP)

( * ) Notice: Subject to any disclaimer, the term of this patent is extended or adjusted under 35 U.S.C. 154(b) by 0 days.

(21) Appl. No.: 14/112,205

(22) PCT Filed: Jun. 22, 2011

(86) PCT No.: PCT/JP2011/064284
§ 371 (c)(1),
(2), (4) Date: Oct. 16, 2013

(87) PCT Pub. No.: WO2012/176293
PCT Pub. Date: Dec. 27, 2012

(65) Prior Publication Data
US 2014/0035686 A1 Feb. 6, 2014

(51) Int. Cl.
| H03B 9/10 | (2006.01) |
| H03B 1/00 | (2006.01) |
| H01J 23/02 | (2006.01) |
| H01J 23/213 | (2006.01) |
| H01J 25/587 | (2006.01) |
| H03L 7/04 | (2006.01) |
| H01J 25/50 | (2006.01) |

(52) U.S. Cl.
CPC ... *H03B 1/00* (2013.01); *H03L 7/04* (2013.01); *H01J 23/02* (2013.01); *H01J 25/50* (2013.01); *H01J 23/213* (2013.01); *H01J 25/587* (2013.01)

(58) Field of Classification Search
CPC .............. H01J 23/02; H01J 25/50; H03L 7/04
USPC .................. 331/5, 6, 96, 90; 315/39.51, 5.13
See application file for complete search history.

(56) References Cited

U.S. PATENT DOCUMENTS 3,882,419 A * 5/1975 Swartz et al. .................... 331/96

FOREIGN PATENT DOCUMENTS

| JP | 20003676 A | 1/2000 |
| JP | 2003124717 A | 4/2003 |
| JP | 2006100066 A | 4/2006 |

(Continued)

OTHER PUBLICATIONS

International Preliminary Report on Patentability, App PCT/JP2011/064284 dated Dec. 23, 2013.

(Continued)

*Primary Examiner* — Arnold Kinkead
(74) *Attorney, Agent, or Firm* — Perman & Green, LLP

(57) ABSTRACT

The switching element is provided in a state of being electromagnetically coupled to the cavity resonator of the high frequency oscillator; the bias voltage applying terminal is connected to one electrode of the switching element; another electrode of the switching element is electrically connected to the cavity resonator (the anode shell in FIG. 1); the metal plate having a size enough for reflecting an electric wave to be transmitted before and after the switching element in a high-frequency manner is provided at any one end of the switching element; and by applying a bias voltage to the switching element and varying that, a reactance of the switching element is changed and a resonance frequency of the cavity resonator is varied. By this method, an oscillation frequency can be varied greatly relative to a small change in a bias voltage.

4 Claims, 5 Drawing Sheets

(56) References Cited

FOREIGN PATENT DOCUMENTS

| | | | |
|---|---|---|---|
| JP | 2009277379 | A | 11/2009 |
| JP | 201160591 | A | 3/2011 |

OTHER PUBLICATIONS

International Search Report, App PCT/JP2011/064284 dated Aug. 9, 2011.

\* cited by examiner

METHOD FOR VARYING OSCILLATION FREQUENCY OF HIGH FREQUENCY OSCILLATOR

CROSS-REFERENCE TO RELATED APPLICATIONS

This application is the National Stage of International Application No. PCT/JP2011/064284 International Filing date, 22 Jun. 2011, which designated the United States of America, and which International Application was published under PCT Article 21 (s) as WO Publication 2012/176293 A1 the disclosure of which is incorporated herein by reference in its entirety.

BACKGROUND

The presently disclosed embodiment relates to a method for varying an oscillation frequency of a high frequency oscillator such as an electron tube and a solid-state oscillator oscillating a high frequency wave such as a micro wave, and in particular relates to a method for varying an oscillation frequency of a high frequency oscillator such as a magnetron, in which the structure of the oscillator is simple and the oscillation frequency can be varied with an electrical signal from the outside of the oscillator.

FIG. 8 shows a basic structure of a magnetron which is a kind of an electron tube, for varying a reactance of a switching element with a bias voltage from the outside of the magnetron (for example, see Patent Document 1). In the magnetron, an anode, in which a cathode 1 is disposed at the center thereof, is provided outside the cathode 1 concentrically therewith. The anode is composed of a cylindrical anode shell 2, a plurality of anode vanes 3 extending from the inner wall of the anode shell 2 toward the cathode 1 so as to divide the inside of the anode shell 2 into plural portions in a circumferential direction, and straps 4 connecting the alternate anode vanes. This anode functions not only as a positive electrode against the cathode 1 but also as a resonator determining the oscillation frequency. Small cavities separated by the anode vanes form resonant cavities resonating at a frequency close to the oscillation frequency.

The straps 4 are provided in order to best stabilize the stable π-mode oscillation of the magnetron, and a line-shaped metal conductor is used as the strap. The anode vanes 3 serving as partitions of the resonant cavity segmented into a plurality of spaces as mentioned above are connected alternately with the strap. In a magnetron having such a structure, its oscillation frequency is determined by a reactance of the resonant cavity and a reactance which is caused by the straps 4. In addition, in such a configuration of the magnetron as shown in FIG. 8, to vary a resonance frequency of the magnetron by applying a bias voltage from the outside of the magnetron, a through-hole 11 is formed in the anode shell 2 which is a wall of the resonant cavity, and a window 12 made of a low dielectric loss material such as ceramic or glass is provided to close the outer side of this through-hole 11 and to maintain a vacuum condition of the resonant cavities (magnetron tube) (that is, the resonant cavities are sealed from outside). A metal rod (rod-like metal) 14 is provided outside this window 12 to cover a part of the front of the window 12. One end of this rod 14 is supported on the anode shell 2 with a supporting member (metal) 16a in a state of being electrically insulated via an insulator 15, and serves as a terminal 14T to which a bias voltage is applied. Further, one end of the switching element 18 made of a PIN diode is connected to another end of the rod 14, and another end of this switching element 18 is electrically connected (short-circuited) to the anode shell 2 with a supporting member (metal) 16b. An electric field of the resonant cavities extends to the outside of the resonant cavities via the through-hole 11 and the window 12. Usually, when the bias current is not flowing, the switching element 18 is turned off and the rod 14 is placed apart from the electric potential of the anode shell 2, and thus, the extended electric field is not blocked and the resonance frequency increases above the frequency of the original resonant cavity. In other words, the reactance outside the tube acts on the reactance in the anode shell 2 which is the tube.

Subsequently, when the bias current is flowed and the bias voltage is applied between the anode shell 2 and the terminal 14T to turn on the switching element 18, the rod 14 is short-circuited with the anode shell 2 in a high-frequency manner, and the switching element 18 and the rod 14 block the electric field extended from the window 12 while increasing the Rf resistance with the increase of the bias current. As a result, the oscillation frequency decreases as the bias current increases. As one of conventional methods, there is a method of coupling another resonator to the primary resonant cavity of the magnetron and changing the reactance of this another resonator to thereby changing the resonance frequency of the composite resonant cavity. However, the configuration of the presently disclosed embodiment is such that another resonator is not coupled for changing the resonance frequency and the resonance frequency of the single resonant cavity is changed by changing the electric field extended from the resonant cavity (coupling factor at the portion of the window 12) without providing another resonator.

FIG. 9 shows an another basic structure for varying an oscillation frequency of a magnetron being a kind of an electron tube by changing a reactance of a switching element using a bias voltage from the outside of the magnetron (for example, see Patent Document 2). The structure of the main part of the magnetron is the same as that of FIG. 8, and is composed of a cathode 1, an anode shell 2, anode vanes 3, and straps 4. A coaxial central conductor 17 is inserted into a resonant cavity of the anode shell 2 through a through-hole 11. A dielectric portion 25 covering the through-hole 11 is provided outside the through-hole 11 formed on the wall surface of the anode shell 2. This dielectric portion 25 is made of a dielectric material such as ceramic or glass, for example, and is mounted so as to be in a state of maintaining a vacuum of the magnetron tube.

In this anode shell 2, an end of the coaxial central conductor 17 is connected to a part of the anode structure such as the anode vane 3 for coupling with a reactance of the resonant cavity, and the other end passes through the dielectric portion 25 to be lead to the outside, and is connected to the switching element 18 via an external conductor 34. In other words, the dielectric portion 25 is placed between the coaxial central conductor 17 and the anode shell 2, and serves as an insulator of a dielectric member for a coaxial structure. A bias voltage is applied to the other end of this switching element 18. In other words, by connecting the other terminal of the bias to a point in which its electric potential in a direct flow is the same as that of the anode shell 2, the bias direct current flows through the switching element 18, external conductor 34, coaxial central conductor 17, anode vane 3 and anode shell 2 in this order. The current direction is determined in the case of using a PIN diode in the switching element 18 since it has a polarity. The bias voltage is applied in accordance with its polarity depending on the attachment direction of the switching element 18. In the case where the diode of the switching element 18 is replaced by a varactor diode, an oscillation frequency is variable within a wide range by reversing the bias direction since a change of a reactance by application of the bias voltage is large.

As mentioned above, it is known that there are electronic frequency tuning magnetrons, in which an oscillation frequency is varied by applying a bias voltage to a switching element 18 from the outside to change a reactance of the switching element 18, thereby producing an effect on a resonance frequency of a cavity of a magnetron being coupled to the switching element 18 in a high-frequency manner.

Additional background information may be found in Japanese publications JP 2009-277379 A and JP 2011-060591 A

SUMMARY

As mentioned above, a principle for materializing electronic frequency tuning magnetrons is described in JP 2009-277379 A and JP 2011-060591 A. However, there was a demerit such that when applying a bias voltage, a range of a changing oscillation frequency is narrow and the characteristic range of the switching element is limited. Further, there is a demerit such that stability of an oscillation output is significantly affected by characteristics of the switching element and attachment conditions such as a contact state and an attaching accuracy. In other words, there is a problem that an oscillation output level changes greatly in the case where a change of an impedance of a switching element relative to a bias voltage greatly changes not only a reactance but also a resistance.

The presently disclosed embodiment has been made in the light of the above-mentioned problems, and an object of the presently disclosed embodiment is to provide a method for oscillating a magnetron or the like with a stable output relative to a wide range of impedance characteristics of a switching element, thereby enabling an oscillation frequency to be desirably varied by a bias voltage.

The method for varying an oscillation frequency of a high frequency oscillator according to the presently disclosed embodiment is a method for varying an oscillation frequency of a high frequency oscillator having a cavity resonator, and the method comprises providing a switching element in a state of being electromagnetically coupled to the cavity resonator of the high frequency oscillator; connecting a bias voltage applying terminal to one electrode of the switching element; connecting electrically an another electrode of the switching element to the cavity resonator; providing a metal plate having a size enough for reflecting a high frequency wave to be transmitted through the switching element at any one end of the switching element; and varying a bias voltage by applying the bias voltage to the switching element, and thereby changing a reactance of the switching element and a resonance frequency of the cavity resonator.

Here, reflecting a high frequency wave includes that a high frequency electric field is in a state of reflecting even in the case of connection in a condition of direct current.

The high frequency oscillator may be an electron tube, in which the cavity resonator is formed inside a vacuum envelope, and the switching element is disposed so as to be coupled to an electromagnetic field to be passed to the outside of the vacuum envelope via a through-hole formed partly on a wall of the vacuum envelope or to be led out by a line-shaped conductor coupled electromagnetically to the cavity resonator.

Here, being coupled electromagnetically means that it includes not only being coupled in a high frequency manner with an electromagnetic field extending in a space but also being in a state of being connected directly through a conductor to flow a high frequency current.

A casing made of metal is provided so as not only to cover the switching element and a part of a conductor to be connected to the switching element but also not to come into contact with the switching element and the conductor to be connected to the switching element, and a distance between an opposite surface of the metal plate located opposite to a surface contacting the switching element and an end surface of the casing facing the opposite surface of the metal plate is less than ¼ of an oscillation wavelength, thereby enabling a range of variable frequency to be increased. In other words, generally it is preferable to set a distance between the metal plate and the end surface of the casing to be ¼ of an oscillation wavelength $\lambda$ since the electric field becomes maximum, and therefore the distance is set to be $\lambda/4$. However, as a result of various studies on characteristic impedance, etc. in a state including the metal plate, etc., it was found that by setting the distance to be smaller than $\lambda/4$, specifically $\lambda/6$ or less and $\lambda/15$ or more, a change of the oscillation frequency can be made the largest even with the same change of the bias voltage. Further, it was found that an influence by the switching element characteristic, a contacting state or an attaching accuracy can be reduced.

Here, the conductor means that they include, in addition to metal, various electrically conductive members such as a connecting electrode terminal, an external conductor and a coaxial central conductor which are explained infra.

It is preferable to insert a dielectric sheet between the surface of the opposite metal plate located opposite to the switching element and the end surface of the casing, since a given space can be provided between the metal plate and the end surface of the casing and fluctuation of an oscillation output by the bias voltage can be inhibited.

According to the method for varying the oscillation frequency of the high frequency oscillator of the presently disclosed embodiment, high-powered microwaves having a desired frequency can be obtained with a simple configuration and a significantly quick response by using an external electric signal without using a mechanical means having a movable part. Further, a wide variable range of oscillation frequency can be obtained without providing a switching element in a cavity resonator such as inside of the electron tube and hindering productivity. Therefore, there is an effect such that the electron tube such as a highly reliable magnetron can be obtained at low cost without inhibiting productivity. Furthermore, it is feasible to adjust a frequency drift of the magnetron and to select the frequencies for suppressing interferences. Also, since much of compressed information can be obtained with low power by modulating pulses, detection performance of radar can be enhanced remarkably. Further, since pulse compression can be made by using a signal having a long pulse width, there is an effect that not only detection distance resolution including a near distance can be enhanced but also an occupied frequency bandwidth can be decreased.

Further, according to the presently disclosed embodiment, an influence by contact with the switching element and its location can be reduced, and therefore, there is an effect that adjustment of frequency at the time of production can be simplified and there is contribution to cost reduction.

As a result, it is possible to provide an oscillation source of a micro wave which can be used by varying its frequency within a wide range by an external signal, and therefore, there is a merit that it is feasible to adjust a frequency drift of the magnetron, etc. and to select the frequencies for suppressing interferences. Further, by varying a frequency with a quick response, a change of a frequency in a pulse can be carried out and a modulated wave can be oscillated, thereby increasing an amount of information contained in a signal to a large extent and remarkably enhancing detection performance of radar.

DETAILED DESCRIPTION

Figure 1:
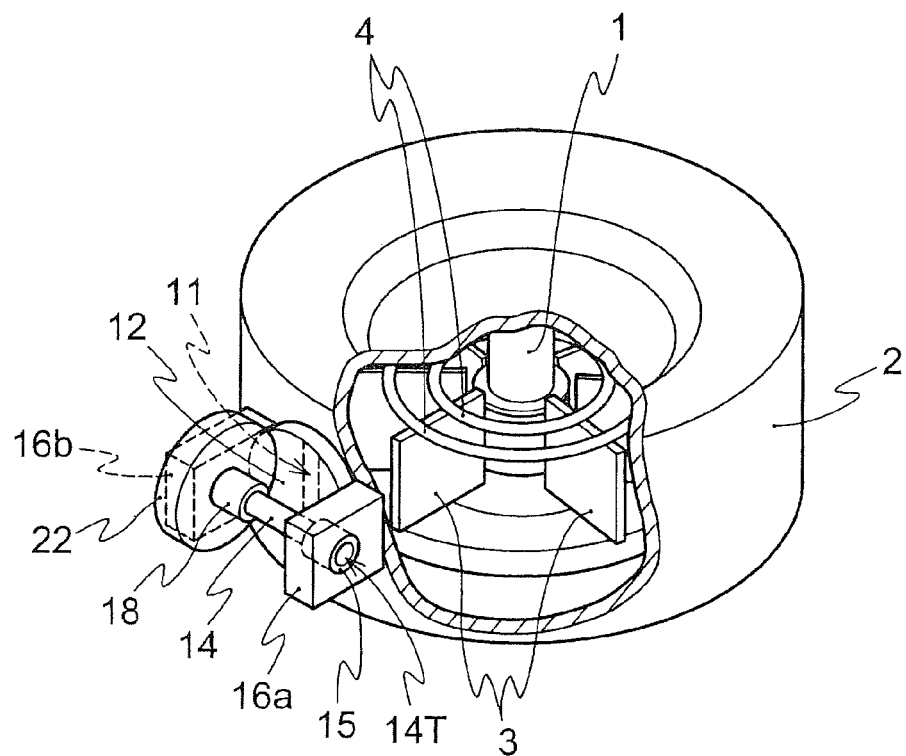
FIG. 1 is a perspective view of a configuration of a magnetron for explaining one embodiment of the method for varying an oscillation frequency of the presently disclosed embodiment.

FIG. 1 shows one embodiment of the method of the presently disclosed embodiment for varying an oscillation frequency by applying a bias voltage from the outside using a magnetron. As compared with the configuration of the conventional magnetron shown in FIG. 8, there is a difference in that a metal plate (contact plate) 22 is provided at one end of the switching element 18. In other words, in the method for varying an oscillation frequency of a high frequency oscillator of the presently disclosed embodiment, the switching element 18 is disposed in a state of being electromagnetically coupled to the cavity resonator of the high frequency oscillator (including a state of an electromagnetic field being transmitted from the cavity resonator in the vacuum or air, or a state of electromagnetic field being led to the outside from the cavity resonator via a conductive wire which is coupled with the cavity resonator through a loop, or a state of electromagnetic field being led to the outside by a conductive wire directly connected to the cavity resonator, hereinafter the same); a bias voltage applying terminal 14T is connected to one electrode of the switching element 18; an another electrode of the switching element 18 is electrically connected to the cavity resonator (anode shell 2 in the example shown in FIG. 1); a metal plate 22 having a size enough for reflecting a high frequency wave to be transmitted through the switching element 18 is provided at any one end of the switching element 18; and by applying a bias voltage to the switching element 18 and varying the bias voltage, thereby changing a reactance of the switching element 18 and varying a resonance frequency of the cavity resonator.

FIG. 1 shows an example, in which the switching element 18 is provided so as to be coupled with the cavity resonator of the magnetron by the electromagnetic field passing through the through-hole 11 and extending in a space out of the magnetron. The high frequency oscillator is not limited to a magnetron, and electron tubes for high frequency wave such as klystrons and CFAs, and solid-state oscillators having a cavity resonator can be applied.

In the magnetron shown in FIG. 1, a metal rod 14 is provided so as to have an influence on the electromagnetic field led-out through the through-hole 11 being coupled with the cavity resonator inside the anode shell 2 in a high frequency manner. One end of this metal rod 14 is held by a first supporting member 16a made of metal through an insulator 15. Another end of the metal rod 14 is connected to the switching element 18, and usually is held by a second supporting member 16b. In this case, the switching element 18 is being connected to the metal plate 22. This metal plate 22 is used for reflecting a high frequency wave transmitted through or before the switching element 18, and it is preferable that the metal plate 22 is larger than the diameter of the cross-section of the conductor (the metal rod 14, the switching element 18, and the like) since the reflection is achieved securely. However, as a result of intensive studies by the present inventor, as explained infra based on FIG. 7, it is preferable that the metal plate 22 is formed so that a distance from its center to its outer periphery is $\lambda/10$ or more, in which $\lambda$ is an oscillation wavelength. Here, it can be considered that for example, in the case of transmitting a high frequency wave through the metal rod 14 and the switching element 18, these metal rod 14 and switching element 18 are central conductors of the coaxial structure (In the example shown in FIG. 1, an external conductor is not shown therein, but it is preferable to provide a casing as an external conductor as explained infra). It is known that the characteristic impedance of the coaxial structure is shown by the following equation (1) on the assumption that an outer diameter of a central conductor is "a", an inner diameter of an external conductor is "b" and a dielectric constant of a dielectric provided between the central conductor and the external conductor is $\in r$.

$$Z0 = 138 \in r^{-1/2} \cdot \log(b/a) \tag{1}$$

In this equation, as the outer diameter "a" of the metal plate 22 increases abruptly relative to the diameter of the conductor, a difference in characteristic impedance between the conductor and the metal plate 22 becomes large, thereby causing mismatching. Therefore, the transmitted high frequency wave is nearly in a state of total reflection. In such a state of nearly being total reflection, if a reactance of the switching element 18 provided in front of the metal plate changes, since such a change has an effect on a bias current sensitively, even if a change of a bias current to be flowed in the switching element 18 is slight, an oscillation frequency thereof can be changed to a large extent.

It is preferable that the larger the outer diameter of the metal plate 22 relative to the diameter of the conductor is, the larger the difference in characteristic impedance is. As explained infra based on FIG. 7, it is preferable that the metal plate has a radius of $\lambda/10$ or more. From this point of view, the outer shape of the metal plate 22 is not limited particularly. However, since the outer shape has an effect on the distance from the center of the conductor (the metal rod 14, the switching element 18, and the like), a circular shape is preferable. However, the outer shape may be rectangular as long as the distance from its center to each side is $\lambda/10$ or more, in which $\lambda$ is an oscillation wavelength. In the case where this distance from the center of the metal plate is increased, if a casing functioning as an external conductor as explained infra is provided, it is necessary that the metal plate does not contact with the casing.

Figure 8:
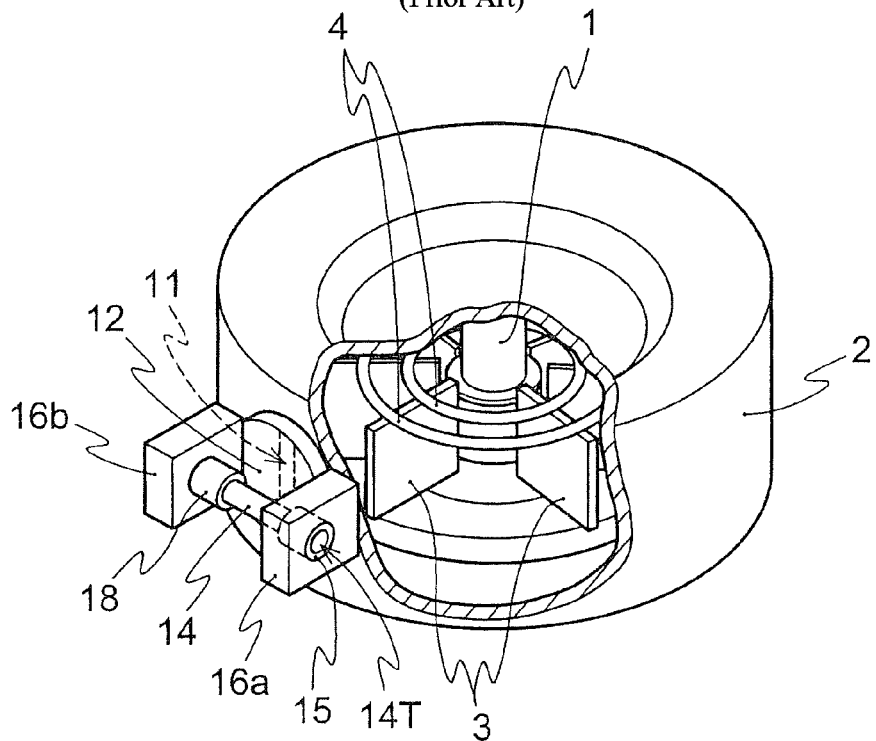
FIG. 8 is a view of a configuration of a conventional electronic frequency tuning magnetron.

The structure of the magnetron shown in FIG. 1 is the same as the structure shown in FIG. 8. The cylindrical anode shell 2 constituting the anode is provided concentrically with the cathode 1, and the anode vanes 3 formed on the inner wall of the anode shell 2 radially toward the cathode 1 are provided, thereby forming a plurality of cavity resonators, in which the anode vanes 3 are connected alternately with the straps 4. In other words, one anode vane between the other anode vanes adjacent to the one anode vane is connected to another anode vane adjacent to the other anode vanes each other with one of the two straps 4, and the other anode vanes are connected each other with another strap 4. By this configuration, not only the alternate anode vanes 3 are connected so as to have the same electric potential but also a phase difference between the neighboring anode vanes is 180° (π-radian). Thus, the cavity resonators are formed so as to oscillate stably with π-mode. A through-hole (a slit in the example of FIG. 1) 11 is formed on the anode shell 2 being a wall surface of resonant cavities, and the outside of this through-hole 11 is sealed by a dielectric window 12 made of a low dielectric loss material such as ceramic or glass. The window as a vacuum envelope maintains a vacuum degree of the resonant cavities inside the anode. The electromagnetic field of micro waves is extended outside the vacuum envelope, and a metal rod (rod-like metal) 14 is disposed at a portion in front of the dielectric window 12 where the electromagnetic field is extending. An end portion 14T of this metal rod 14 is fixed to the first supporting member 16a made of metal via the insulator 15, and the second supporting member 16b is fixed to the anode shell 2. Another end of the metal rod 14 is connected to one end of the switching element 18 made of a PIN diode and the like. Another end of the switching element 18 is electrically connected (short-circuited) to the anode shell 2 by means of the second supporting member 16b made of metal via the metal plate 22.

In the presently disclosed embodiment, as mentioned above, the metal plate 22 is provided on one end of the switching element 18, and therefore, only by making the metal plate 22 have a size enough for reflecting a high frequency wave transmitted through the switching element 18, an impedance of the metal plate 22 changes greatly and a high frequency wave reflection surface can be obtained, thereby making it possible to keep a given distance between the another end of the switching element 18 and the reflection surface, and obtain a stable change in impedance at any time. In other words, without providing such a metal plate 22, by applying a voltage between the end portion 14T of the metal rod 14 and the anode shell 2, a bias current flows through the switching element 18, thereby changing not only the reactance but also the resistance. This resistance change, especially an increase in the resistance lowers the resonant Q factor and the coupling factor. As a result, lowering of an output arises at the time of oscillation. In other words, the oscillation output fluctuates due to the bias voltage. However, by providing the metal plate 22 according to the presently disclosed embodiment, the capacity change of the switching element 18 relative to the reflection surface enables the reactance of the resonator to be changed effectively, which can produce no effect on the resistance. As a result, a change of a coupling factor can be decreased, and the oscillation frequency can be greatly changed stably. In this case, the oscillation output is also stabilized.

Figure 2:
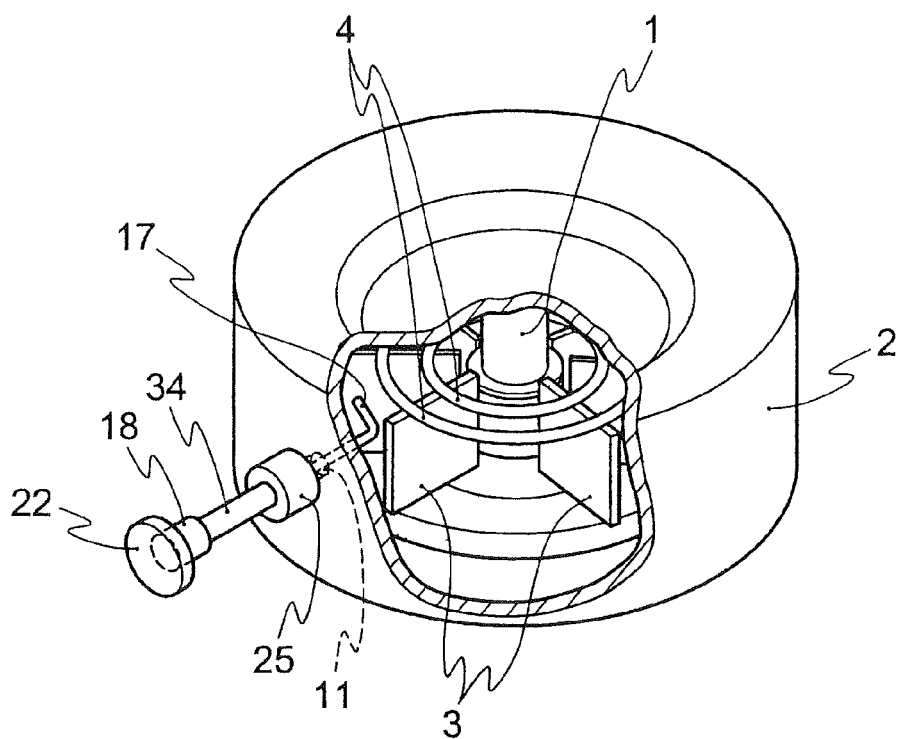
FIG. 2 is a perspective view of a configuration of a magnetron for explaining another embodiment of the method for varying an oscillation frequency of the presently disclosed embodiment.
Figure 9:
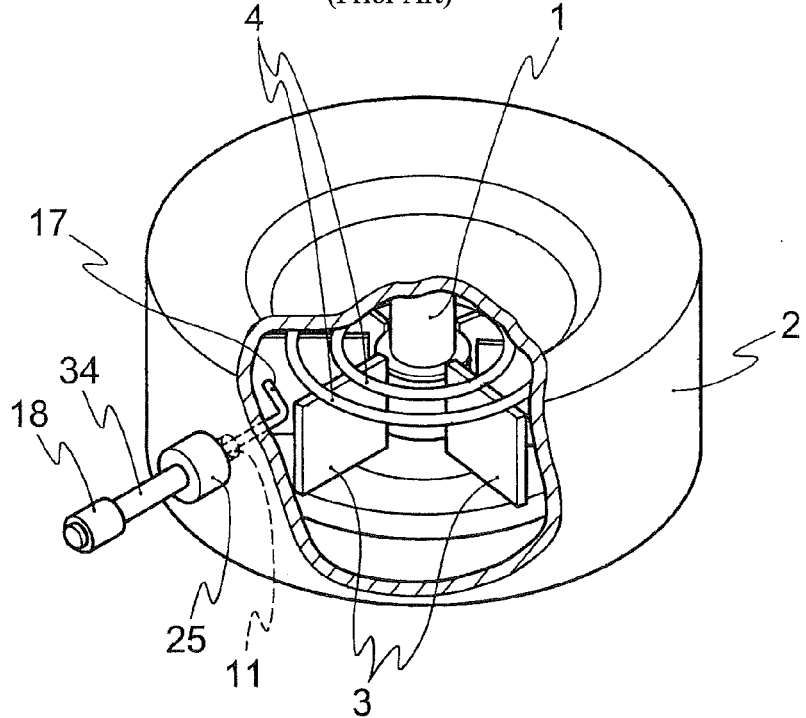
FIG. 9 is a view of another configuration of a conventional electronic frequency tuning magnetron.

FIG. 2 shows another embodiment of the magnetron according to the presently disclosed embodiment which is a kind of an electron tube being capable of varying an oscillation frequency by applying a bias voltage from the outside. FIG. 2 shows a configuration such that the metal plate 22 is added to the conventional magnetron structure of FIG. 9. Therefore, the structure except the metal plate 22 is the same as in FIG. 9. The same numerals are provided on the same parts, and detailed explanation thereon is omitted. The coaxial central conductor 17 coupled with the inside of the anode shell 2 in a high frequency manner is passed through the through-hole 11 (in this figure, a circular hole but not a slit) provided on the anode shell 2 and is connected to the vane 3. With respect to this coupling in a high frequency manner, various modifications thereof can be considered and as long as the conductor is coupled with the inside of the anode shell 2 (cavity resonator) in a high frequency manner, the conductor need not to be connected to the vane 3 as shown in FIG. 2. There are modifications, e.g., the conductor is in the form of loop and is electromagnetically coupled with the inside of the resonant cavity or the conductor is inserted directly into the circumferential end portion of the vane 3 for magnetic coupling. Another end of the coaxial central conductor 17 passes through the dielectric portion 25 provided on the anode shell 2 and is connected to the external conductor 34 so as to seal the through-hole 11 and be able to become a part of the vacuum envelope. The external conductor 34 is connected to one electrode of the switching element 18. On another electrode of the switching element 18 which is not connected to the external conductor 34, the contact plate 22 is provided in contact with the electrode, therefore, a bias voltage can be applied to an end portion of the contact plate. This metal plate 22 is formed so that the distance from its center to its side or circumference is 1/10 or more of the oscillation frequency similarly to the example explained supra. As a result, by applying a bias voltage through the external conductor 34 connected to one electrode of the switching element 18, the circuit connected to this switching element 18 can be in a short-circuited state or the reactance of the circuit can be changed. Meanwhile, since the metal plate 22 located at a given distance from one end of the switching element 18 can be the reflection surface, a stable impedance change can be obtained similarly to the example explained supra. The capacity change of the switching element 18 relative to the reflection surface enables the reactance of the resonator to be changed effectively, and as a result, the oscillation frequency can be largely changed stably. In addition, the coaxial central conductor 17 may be connected directly to the switching element 18 without using the external conductor 34.

Figure 3:
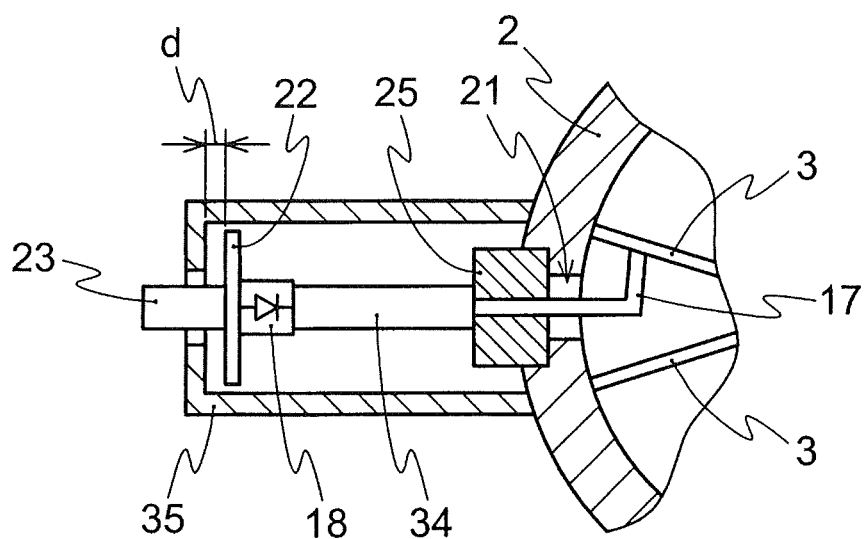
FIG. 3 is a cross-sectional view of a configuration of a magnetron for explaining other embodiment of the method for varying an oscillation frequency of the presently disclosed embodiment.
Figure 5:
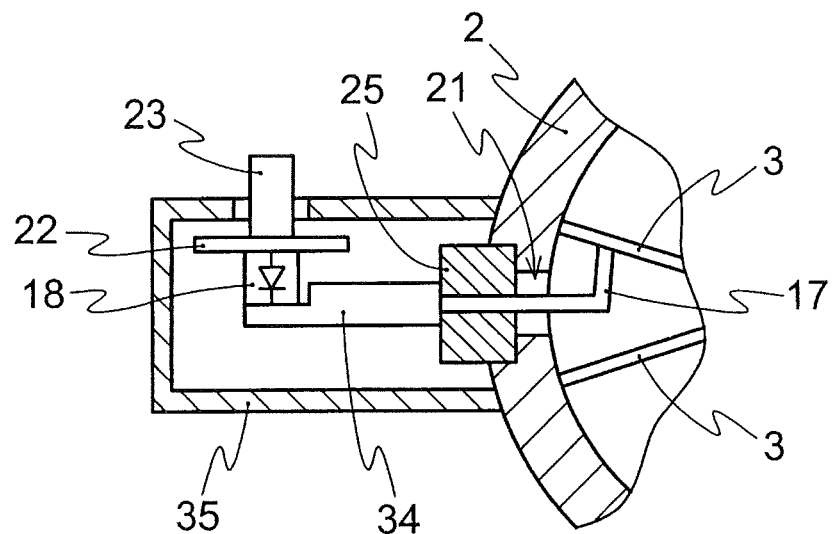
FIG. 5 is a cross-sectional view of a modification of FIG. 3.

Further, FIG. 3 and FIG. 5 show still further embodiments according to the presently disclosed embodiment of the magnetron which is a kind of electron tube, in which the oscillation frequency can be changed by application of an external bias voltage. The example shown in FIG. 5 has the same structure as that of FIG. 3 except that the switching element 18 is connected to the external conductor 34 at a right angle, and therefore, the explanation is made using FIG. 3. This example is a configuration, in which the casing 35 covering the external conductor 34 led to the outside, the switching element 18, and the metal plate 22, which are shown in the embodiment of FIG. 2, is provided, and further a metal bias terminal 23 is provided so as to contact to the another electrode of the switching element 18 through the metal plate 22. In this casing 35, an additional cavity is formed and the casing 35 can be formed into the dimensions of coaxial structure with the coaxial central conductor 17 or the external conductor 34 being the central conductor. However, the casing may be formed simply in such a structure as covering these conductors. This casing 35 functions to protect the parts including the switching element being a structure and prevent the leakage of microwaves. Here, important is a size of the metal plate 22 already explained supra, and the distance from the center of the metal plate 22 to its side or circumference is set to be 1/10 or more of the oscillation wavelength.

Figure 7:
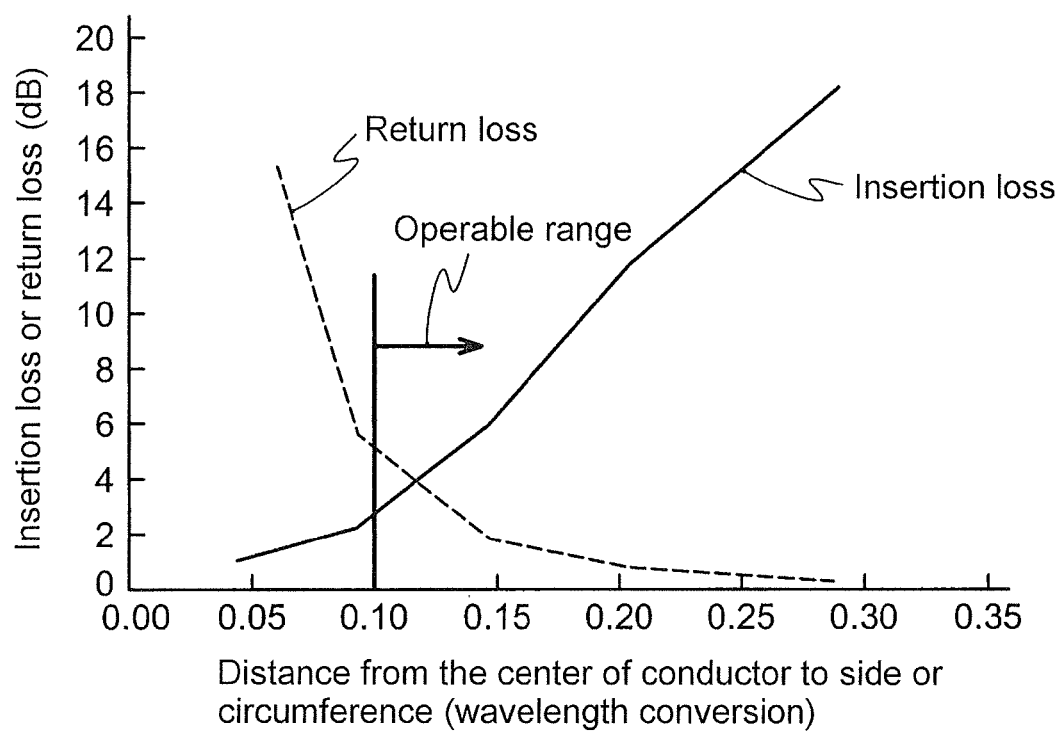
FIG. 7 is a graph of S parameter characteristic of the magnetron of the embodiment of FIG. 2.

FIG. 7 shows the example of measurement of S parameters (insertion loss and return loss) when viewing the side of the switching element 18 from the anode (cavity resonator) side of the magnetron in the case where the distance from the center of the metal plate 22 to its side or circumference is changed in the configuration of FIG. 3. When the distance from the center of the metal plate 22 is changed so as to be increased, it can be seen that the insertion loss increases and the return loss decreases. From this, it can be seen that the impedance of the metal plate 22 is changed largely, and a high frequency reflection surface can be obtained. Therefore, since the metal plate 22 located at a given distance from one end of the switching element 18 can be the reflection surface, a stable impedance change can be obtained. The capacity change of the switching element 18 relative to the reflection surface enables the reactance of the resonator to be changed effectively, and as a result, the oscillation frequency can be largely changed stably. In addition, the space between the casing 35 mounted supplementarily and the metal plate 22 is ⅙ or less of the oscillation wavelength. In other words, while in principle, the distance between the metal plate and the end of the casing is preferably ¼ of the oscillation wavelength $\lambda$, and is set to be a distance of $\lambda/4$, as a result of various studies, it has been found that by setting the distance to be $\lambda/4$ or less, particularly $\lambda/6$ or less, further $\lambda/15$ or more, the change of oscillation frequency relative to the same bias voltage change can be the largest. By using such a distance, the wall surface of the casing 35 mounted supplementarily does not affect the metal plate 22, and the metal plate 22 acts so as to stably carry out the above-mentioned functions.

In the case of a magnetron of 9.4 GHz band with the configuration of FIG. 3, a variable oscillation frequency of 22 MHz could be obtained stably when the metal plate 22 was formed into a size having a radius of about 5 mm (about ⅙ of oscillation wavelength), the distance "d" between the surface of the metal plate 22 at the opposite side of the switching element 18 and the end surface of the casing 35 was set to be 2 mm (about 1/16 of oscillation wavelength), a PIN diode was used as the switching element 18, and the bias voltage was changed from 0 V to 0.6 V. In addition, in the case where the metal plate 22 was not provided and the same conditions as above were used, only a change from 3 MHz to 11 MHz was obtained and further the oscillation frequency was unstable.

Figure 4:
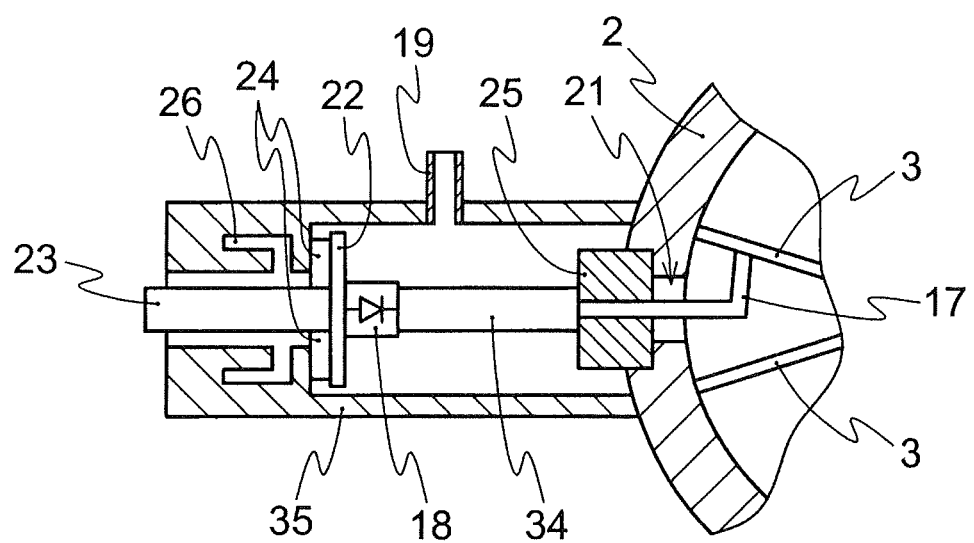
FIG. 4 is a cross-sectional view of a configuration of a magnetron for explaining other embodiment of the method for varying an oscillation frequency of the presently disclosed embodiment.
Figure 6:
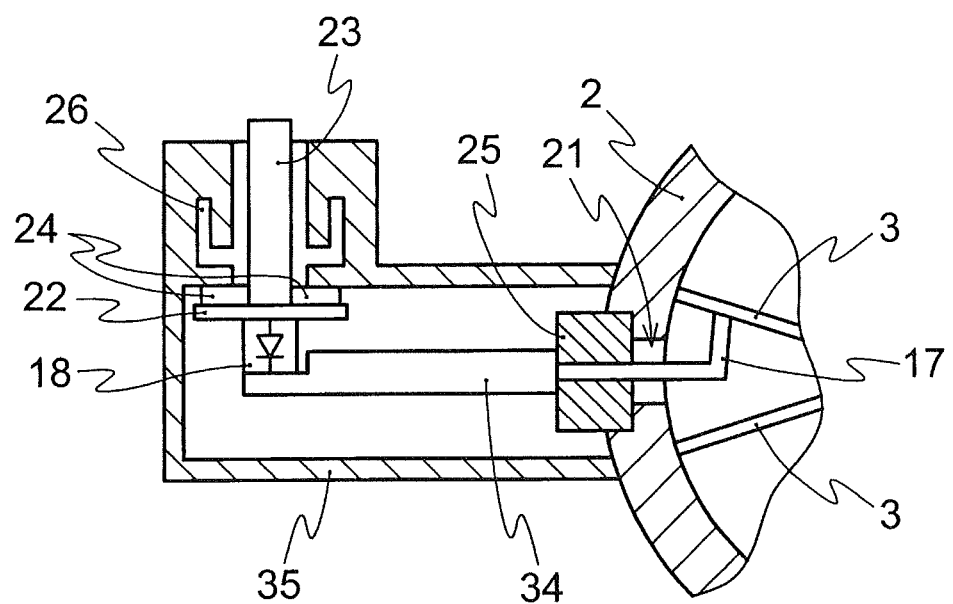
FIG. 6 is a cross-sectional view of a modification of FIG. 4.

FIG. 4 and FIG. 6 show further improved structures of FIG. 3. In FIG. 6, the direction of the switching element 18 is only changed by 90° from that shown in FIG. 4 similarly to FIG. 5, and other structures are the same as those of FIG. 4, and therefore, the explanation is made using FIG. 4. In the configuration shown in FIG. 4, a dielectric disc (dielectric plate) 24 is provided between the metal plate 22 and the end portion of the casing 35 of the configuration of FIG. 3. This configuration makes it possible to stably accurately maintain the space of ⅙ or less of the oscillation wavelength as explained in the configuration of FIG. 3 and carry out the function of largely changing the oscillation frequency and the inhibition of fluctuation of the oscillation output due to the bias voltage.

In addition, in FIG. 4, a bias terminal 23 is passed through the center of the choke structure 26, thereby enabling the leakage of micro waves through the bias terminal 23 to be prevented.

Further, by exhausting the cavity portion inside the casing 35 mounted supplementarily or filling an inert gas thereinto, discharging due to increase of the inside electric field can be prevented. When the oscillation output should be increased, the electric fields of the switching element therein and the peripheral metal parts increase. Therefore, when other metal is disposed around thereof, it causes generation of discharging. However, exhausting from an exhaust tube 19 or filling an inert gas is effective for prevention of discharging. Further, in the case of loading a magnetron on an airplane or using it on highlands, the periphery of the switching element 18 is exposed to a low pressure since it is located outside the tube (outside the vacuum envelope). In that case, corona discharging may arise, thereby causing degrading of the parts. However, if the inside of the casing is under vacuum, corona discharging does not arise and occurrence of the corona discharging can be prevented also with the use of an inactive gas.

In each of the above-mentioned aspects, the explanations were made on the assumption that the switching element 18 is coupled to one part inside the anode for easy understanding. However, the aspects may be effected by taking such coupling from a plurality of resonant cavities of the electron tube and using a plurality of switching elements 18. In the presently disclosed embodiment, the structure (of the high frequency oscillator) is basically configured such that variation of a frequency can be carried out within a wide range with a single switching element. In addition thereto, a plurality of switching elements can be used for obtaining other effects, but there arises no need of providing excessively many of them. Further, improvement of stability of oscillation output can be made, and when a large output is intended to be obtained, a long-term stable oscillation can be carried out without causing a failure. Furthermore, oscillation frequency adjustment at the time of production can be simplified.

It can be considered that diodes are connected to the bias voltage circuits in series in the case of providing a plurality of switching elements. In that case, the number of diodes to be connected to each of the bias voltage circuits may be changed, for example, one for one circuit and two for other circuits. Thereby, the voltage of the circuit with one diode differs from the voltage of the circuit with two diodes when the bias current starts flowing by the voltage applied from a bias voltage generator. In the case of use of a usual silicon diode, when the same bias voltage is applied, the bias current flows with a voltage difference of about 0.6 V per one diode. As a result, an action of the switching element 18 for varying a frequency relative to the bias voltage is deviated, and the frequency is varied more moderately when the characteristic of the switching element 18 is not linear. In addition, the above-mentioned function is exhibited irrespective of the number of diodes 5 and 6 as long as the number of diodes differs between the diodes 5 and 6, wherein either of the diodes may be zero. Further, even when a resistor is inserted in series instead of the diode, the above-mentioned function can be obtained since characteristics of the both change by changing the resistances of the both.

As explained above, in the electronic frequency tuning magnetrons of the aspects of the presently disclosed embodiment, the switching element is disposed outside the tube. Therefore, the electronic frequency tuning magnetrons have no manufacturing limitation as a vacuum tube; there is no need of designing the electronic frequency tuning magnetrons on the basis of especially expensive coaxial type magnetrons and magnetrons having a reactive load structure and external resonant cavity of old design; and conventional magnetrons having a simple configuration can be used. Also, as mentioned above, it is possible to provide an oscillation source of micro waves, the frequency of which can be varied within a wide range with an external signal. Therefore, there is a merit that it is feasible to adjust a frequency drift of the magnetron and to select the frequencies for suppressing interferences. Further, if a change of frequency can be carried out with a quick response, a change of frequency in a pulse can be carried out and a modulated wave can be oscillated. Detection performance of radar can be enhanced remarkably.

EXPLANATION OF SYMBOLS

1 Cathode
2 Anode shell
3 Anode vane
4 Strap
11 Through-hole
12 Window
14 Metal rod
15 Insulator
16a First supporting member
16b Second supporting member
17 Coaxial central conductor
18 Switching element
22 Contact plate
23 Bias terminal
24 Dielectric plate
25 Dielectric portion
26 Choke
34 External conductor
35 Casing

What is claimed is:

1. A method for varying an oscillation frequency of a high frequency oscillator having a cavity resonator, comprising:
   providing a switching element in a state of being electromagnetically coupled to the cavity resonator of the high frequency oscillator;
   connecting a bias voltage applying terminal to one electrode of the switching element;
   connecting electrically an another electrode of the switching element to the cavity resonator;
   providing, at any one end of the switching element, a metal plate having a size enough for reflecting a high frequency wave to be transmitted through the switching element, so that the high frequency wave transmitted through the switching element in a state of being electromagnetically coupled to the cavity resonator is reflected by the metal plate;
   making a bias current flow through the metal plate and the switching element by applying a bias voltage to the switching element; and
   varying the bias voltage, and thereby changing a reactance of the switching element and a resonance frequency of the cavity resonator.

2. The method for varying an oscillation frequency of the high frequency oscillator of claim 1,
   wherein the high frequency oscillator is an electron tube, in which the cavity resonator is formed inside a vacuum envelope, and
   the switching element is disposed so as to be coupled to an electromagnetic field to be passed to the outside of the vacuum envelope via a through-hole formed partly on a wall of the vacuum envelope or to be led out by a line-shaped conductor coupled electromagnetically to the cavity resonator.

3. The method for varying an oscillation frequency of the high frequency oscillator of claim 2,
   wherein a casing made of metal is provided so as to cover the switching element and a part of a conductor to be connected to the switching element and so as not to contact the switching element and the conductor to be connected to the switching element, and
   a distance between an opposite surface of the metal plate located opposite to a surface contacting the switching element and an end surface of the casing facing the opposite surface of the metal plate is less than $1/4$ of an oscillation wavelength.

4. The method for varying an oscillation frequency of a high frequency oscillator of claim 3,
   wherein a dielectric sheet is inserted between the opposite surface of the metal plate located opposite to the switching element and the end surface of the casing.

* * * * *